(12) United States Patent
Maier et al.

(10) Patent No.: US 6,469,505 B1
(45) Date of Patent: Oct. 22, 2002

(54) METHOD AND APPARATUS TO REDUCE PERTURBATION FIELD EFFECTS IN MR IMAGES BY RESTRICTING THE REGION OF INTEREST

(75) Inventors: Joseph K. Maier, Milwaukee, WI (US); Xiaohong Zhou, Houston, TX (US); Steven J. Huff, Hartland, WI (US)

(73) Assignee: GE Medical Systems Global Technology Co., LLC, Waukesha, WI (US)

(*) Notice: Subject to any disclaimer, the term of this patent is extended or adjusted under 35 U.S.C. 154(b) by 0 days.

(21) Appl. No.: 09/540,687

(22) Filed: Mar. 31, 2000

(51) Int. Cl.[7] ................................................. G01V 3/00
(52) U.S. Cl. ...................................... 324/309; 324/307
(58) Field of Search ................................ 324/309, 307, 324/306, 314, 300, 318, 312; 382/128; 600/410, 407

(56) References Cited

U.S. PATENT DOCUMENTS

| | | | |
|---|---|---|---|
| 4,985,677 A | | 1/1991 | Pauly .......................... 324/309 |
| 5,151,656 A | | 9/1992 | Maier et al. ................. 324/309 |
| 5,378,985 A | | 1/1995 | Hinks .......................... 324/309 |
| 5,672,969 A | * | 9/1997 | Zhou et al. .................. 324/309 |
| 5,825,185 A | * | 10/1998 | Liu et al. .................... 324/309 |
| 5,869,965 A | | 2/1999 | Du et al. ..................... 324/309 |
| 5,910,728 A | * | 6/1999 | Sodickson ................... 324/309 |
| 5,923,168 A | | 7/1999 | Zhou et al. .................. 324/309 |
| 6,114,852 A | * | 9/2000 | Zhou et al. .................. 324/309 |
| 6,249,595 B1 | * | 6/2001 | Foxall et al. ................ 382/128 |
| 6,289,232 B1 | * | 9/2001 | Jakob et al. ................. 600/410 |
| 6,353,752 B1 | * | 3/2002 | Madore et al. .............. 600/410 |

OTHER PUBLICATIONS

X, Zhou, et al., "On phase artifacts of high–field fast spin echo", SMRM Abstracts, p. 1248, 1993.

Ahn and Cho, "A new phase correction method in NMR imaging based on autocorrelation and histogram analysis", IEEE Trans. Med. Imaging, vol. MI–6, No. 1, pp 32–36, Mar. 1987.

* cited by examiner

*Primary Examiner*—Edward Lefkowitz
*Assistant Examiner*—Tiffany A. Fetzner
(74) *Attorney, Agent, or Firm*—Timothy J. Ziolkowski, Esq.; Michael A. Della Penna, Esq.; Carl B. Horton, Esq.

(57) ABSTRACT

A method and apparatus for correcting ghost artifacts that are related to orthogonal perturbation magnetic fields is disclosed. The technique includes acquiring MR data and an MR reference scan, each in the presence of orthogonal perturbation magnetic fields. However, the region of interest for the MR reference scan is limited to a relatively narrow band within the imaging subject. Preferably, the narrow band is selected in the vicinity of the magnet iso-center and parallel to the readout direction. Alternatively, the narrow band can also be selected in the limited region where the orthogonal perturbation fields are either minimal or constant along the phase encoding direction, and parallel to the readout direction. The selection of the relatively narrow band is accomplished by either spatially saturating surrounding regions, or using a two-dimensional spatially selective RF pulse. Phase correction values can then be calculated from a more accurately defined slope and intercept of the phase of the MR reference scan and used to correct the MR data. A reconstructed MR image using this technique has reduced ghost artifacts otherwise caused by the adverse effects of the orthogonal perturbation fields in the phase correction process.

23 Claims, 3 Drawing Sheets

METHOD AND APPARATUS TO REDUCE PERTURBATION FIELD EFFECTS IN MR IMAGES BY RESTRICTING THE REGION OF INTEREST

BACKGROUND OF THE INVENTION

The present invention relates generally to magnetic resonance imaging (MRI), and more particularly to a method and apparatus to reduce ghosting artifacts, resulting from orthogonal perturbation fields, in MR images acquired using fast imaging techniques.

When a substance such as human tissue is subjected to a uniform magnetic field (polarizing field $B_0$), the individual magnetic moments of the spins in the tissue attempt to align with this polarizing field in the z direction, but precess about it in random order at their characteristic Larmor frequency. If the substance, or tissue, is subjected to a magnetic field (excitation field $B_1$) which is in the x-y plane and which is at or near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting MR signals are digitized and processed to reconstruct the image using one of many well-known reconstruction techniques.

Imperfections in the linear magnetic field gradients ($G_x$, $G_y$ and $G_z$) produce artifacts in the reconstructed images. It is a well-known problem, for example, that eddy currents produced by gradient pulses will distort the gradient fields and produce image artifacts. Methods for compensating for such eddy current errors are also well known and are disclosed in U.S. Pat. Nos. 4,698,591; 4,950,994; and 5,226,418, for example. It is also known that the gradients may not be perfectly uniform over the entire imaging volume, which may lead to image distortion. Methods for compensating this non-uniformity are described, for example, in U.S. Pat. No. 4,591,789.

Other than uncompensated eddy current errors and gradient non-uniformity errors that escape correction, it is often assumed that the magnetic field gradients ($G_x$, $G_y$, and $G_z$) produce linear magnetic fields exactly as programmed, thus spatially encoding the MR data accurately. With these gradients, the overall static magnetic field at location (x,y,z) is conventionally given as $B_0+G_x(x)+G_y(y)+G_z(z)$, and the direction of the field is usually thought to be along the z-axis. This description, however, is not exactly correct. As long as a linear magnetic field gradient is applied, the overall magnetic field direction is changed from the z-axis and its amplitude exhibits higher-order spatial dependencies ($x^2$, $y^2$, $z^2$, $z^3$, ...). These phenomena are a direct consequence of the Maxwell equations which require that the overall magnetic field satisfy the following two condition: $\vec{\nabla}\cdot\vec{B}=0$ and $\vec{\nabla}\times\vec{B}\approx\vec{0}$. The higher-order magnetic fields, referred to as "Maxwell terms" (or Maxwell fields), represent a fundamental physics effect, and are not related to eddy currents or imperfection in hardware design and manufacture.

Many MR scanners still in use to produce medical images require several minutes to acquire the necessary data. The reduction of this scan time is an important consideration, since reduced scan time increases patient throughput, improves patient comfort, improves image quality by reducing motion artifacts and enables dynamic and functional studies. There is a class of pulse sequences which can acquire an image in seconds, or even sub-second, rather than minutes.

One of these fast imaging techniques is the Rapid Acquisition Relaxation Enhanced (RARE) sequence which is described by J. Hennig et al. in an article in *Magnetic Resonance in Medicine* 3,823–833 (1986) entitled "RARE Imaging: A Fast Imaging Method for Clinical MR." A slight variation of the RARE sequence produces a fast spin echo (FSE) sequence which is used for clinical diagnosis in many commercial scanners. Images acquired using an FSE sequence are very susceptible to artifacts caused by eddy currents induced by the rapidly changing magnetic field gradients. While eddy current compensation techniques are adequate for scans performed with conventional MRI pulse sequences, it has been observed that image artifacts caused by eddy currents are frequently present in FSE scans.

Echo-planar imaging (EPI) is another ultrafast MR imaging technique which is extremely susceptible to system imperfections, such as eddy currents, $B_0$ inhomogeneity, and gradient group delays. In the presence of eddy currents, for example, ghosting artifacts can considerably degrade the image quality and adversely affect EPI's diagnostic value.

To minimize the ghosts created by such fast imaging techniques using echo trains, such as FSE and EPI, a common approach is to employ a reference scan prior to the actual image acquisition. In these reference scans, signals from a full echo train are acquired in the absence of the phase-encoding gradient. Each echo in the echo train is Fourier transformed along the readout direction to obtain a set of projections. Spatially constant and linear phase errors, $\phi_0$ and $\phi_1$, are then extracted from the projections, followed by phase corrections using $\phi_0$ and $\phi_1$, either during image acquisition, as in the case of FSE, or in image reconstruction, as in the case of EPI.

This type of phase correction assumes that spatially varying magnetic fields along the phase-encoding direction are negligible during the reference scans. However, when the Maxwell terms and other perturbation fields are considered, this assumption does not hold, especially when a strong gradient is used at relatively low static magnetic fields. In addition to the Maxwell terms, other factors that can cause perturbations to the reference scans, that can result in incomplete or erroneous phase corrections, include linear eddy currents from any gradient to the phase-encoding axis, a magnetic field inhomogeneity in the phase-encoding direction, and/or magnetic hysteresis that creates phase encoding direction field variations. Together with the Maxwell terms, these perturbations are herein referred to as orthogonal perturbation fields (OPFs).

In the presence of these fields, signal dephasing along the phase-encoding direction can introduce substantial errors in the constant and linear phase calculations that can lead to incomplete or erroneous phase correction. The perturbation of these terms to the reference scans may be evidenced by the fact that the aforementioned phase correction method works markedly well for axial EPI scans performed on a horizontal superconducting magnet, but not as well for sagittal and coronal scans. In the former case, the EPI readout gradient does not produce a quadratic Maxwell term on the phase-encoding axis, whereas in the latter cases, substantial Maxwell terms can be introduced.

It would therefore be desirable to have a technique to minimize the effects of OPFs on reference scans to thereby reduce ghosting.

SUMMARY OF THE INVENTION

The present invention relates to a method and system to reduce the effects of orthogonal perturbation fields (OPFs) in MR images by restricting the region of interest when acquiring a reference scan that overcomes the aforementioned problems.

The technique of the present invention involves limiting the region of interest when acquiring the MR reference scan to a relatively narrow band within the imaging subject. Preferably, the narrow band is selected parallel to the readout direction, or readout axis, centered about the MR magnet's iso-center where the OPFs are minimal. Alternatively, the narrow band can also be restricted to a region of the field-of-view (FOV) where the OPFs are approximately constant in space. Two techniques are disclosed to limit the region of interest. In one of the techniques, the region of interest is limited by saturating nearby regions which results in two spatial saturation regions on either side of the desired region of interest to create a centralized, relatively narrow band in which reference scan data is acquired. Alternately, a single saturation band can be employed in instances where the object, or patient, is positioned asymmetrically along the phase encoding direction with respect to the iso-center of the MR magnet such that only a single saturation band results in a reduced, narrow band region of interest in the patient. In the other technique, instead of using a saturation pulse, a volume selection technique is employed to create the central band for the reference scan using a two-dimensional spatially selective RF pulse to select the narrow band, preferably, centered about the magnet's iso-center or along the phase encoding direction at a point where the OPF variations are minimal with respect to the phase encoding direction. Using either technique, the width of the selected band in the region of interest must be wide enough to maintain a sufficient signal-to-noise ratio.

In accordance with one aspect of the invention, a method of reducing OPF effects in MR images includes acquiring raw MR data and transforming the raw MR data into MR image data, and acquiring an MR reference scan in the presence of the OPFs. The acquisition of the MR reference scan is limited to a region of interest having a relatively narrow band within the FOV. This technique includes extracting phase correction values from the MR reference scan and performing phase correction on the MR image data using the extracted phase correction values. An MR image can then be reconstructed using the corrected MR image data. By reducing errors from OPFs, the reconstructed MR image is displayed with reduced ghost artifacts.

In accordance with another aspect of the invention, a method of reducing ghost artifacts and minimizing phase errors in MR image acquisition includes acquiring MR data and acquiring an MR reference scan in the presence of OPFs in a limited region of interest parallel to the readout axis. The method includes determining at least one characteristic of the phase of the MR reference scan to determine phase correction values only within the region parallel to the readout axis and performing phase correction on the acquired MR data using the phase correction values.

In accordance with yet another aspect of the invention, an MRI apparatus is disclosed to create MR images with reduced ghost artifacts using a fast imaging technique. The apparatus includes an MRI system having a plurality of gradient coils positioned about a bore of a magnet to impress a polarizing magnetic field, an RF transceiver system, and an RF switch controlled by a pulse module to transmit RF signals to an RF coil assembly and thereby acquire MR images. The MRI apparatus includes a computer programmed to acquire raw MR data and transform the raw MR data to MR image data. The computer is also programmed to acquire an MR reference scan in the presence of OPFs and within a limited region of the FOV. The computer program then causes the computer to extract phase correction values from the MR reference scan and perform phase correction on the MR image data using the extracted phase correction values. An MR image is then reconstructed by the computer using the corrected MR image data. By reducing the OPF effects, the reconstructed image displays reduced ghost artifacts.

In accordance with yet another aspect of the invention, a computer program is disclosed for use with an MRI apparatus which, when executed by a computer, causes the computer and MRI apparatus to acquire MR data of a region of interest, reduce the region of interest in at least one dimension, and acquire an MR reference scan of the reduced region of interest in the presence of a frequency encoding gradient. The reduced region of interest provides a reduction of OPF effects on the MR reference scan in the at least one dimension. Phase correction values can then be obtained from phase characteristics of the MR reference scan, which in turn, are used to correct errors in the MR data. The system then reconstructs an MR image having reduced OPF effects and reduced ghost artifacts.

Various other features, objects and advantages of the present invention will be made apparent from the following detailed description and the drawings.

BRIEF DESCRIPTION OF THE DRAWINGS

The drawings illustrate the best mode presently contemplated for carrying out the invention.

In the drawings.

DETAILED DESCRIPTION OF THE PREFERRED EMBODIMENT

Figure 1:
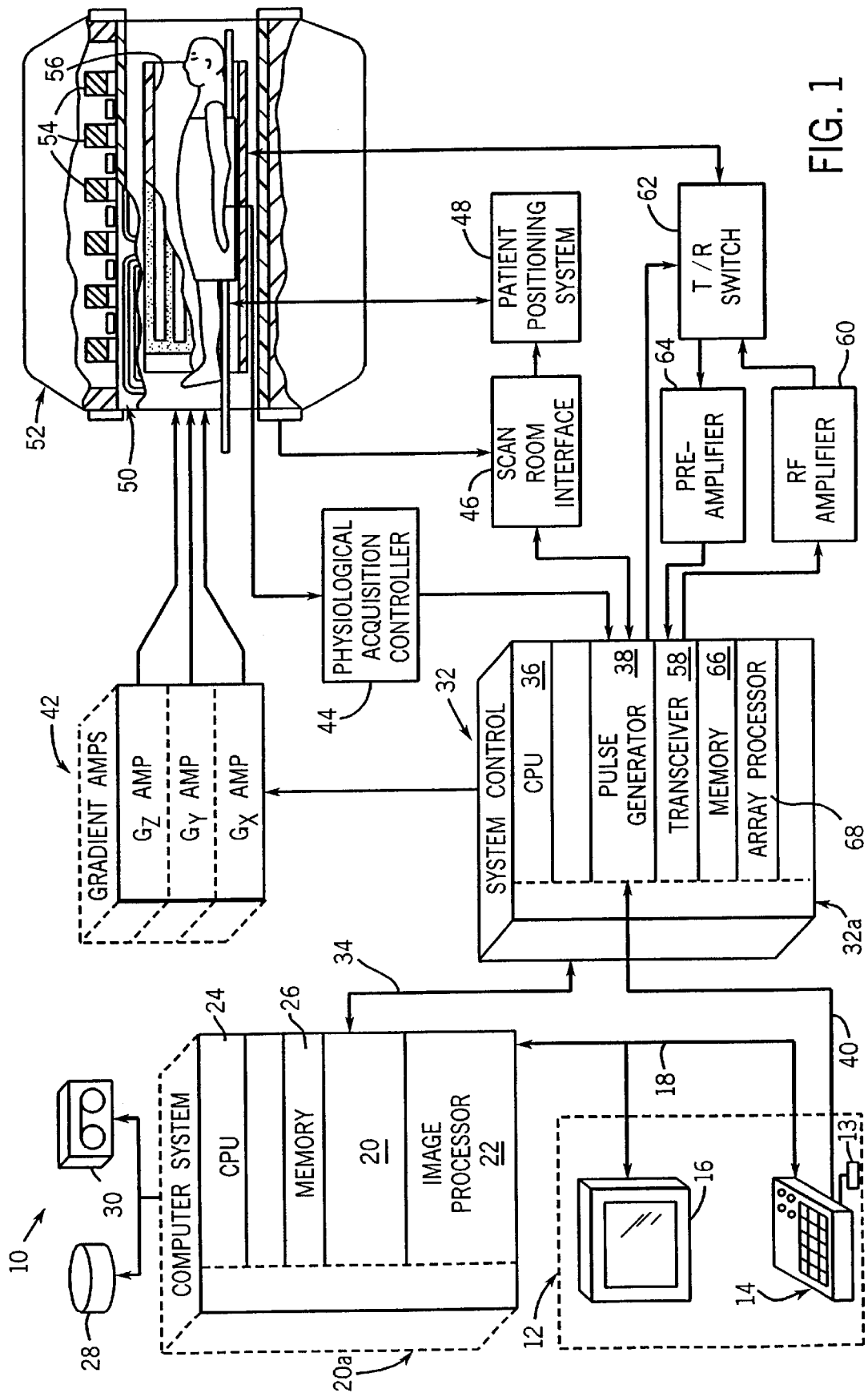
FIG. 1 is a schematic block diagram of an MR image system for use with the present invention.

Referring to FIG. 1, the major components of a preferred MRI system 10 incorporating the present invention are shown. The operation of the system is controlled from an operator console 12 which includes a keyboard or other input device 13, a control panel 14, and a display or screen 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to a disk storage 28 and a tape drive 30 for storage of image data and programs, and it communicates with a separate system control 32 through a high speed serial link 34. The input device 13 can include a mouse, joystick, keyboard, track ball, touch screen, light wand, voice control, or similar device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator which indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 also receives patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$, amplifiers. Each gradient amplifier excites a corresponding physical gradient coil in an assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 during the receive mode. The transmit/receive switch 62 also enables a separate RF coil (for example, a surface coil) to be used in either the transmit or receive mode.

The MR signals picked up by the RF coil 56 are digitized by the transceiver module 58 and transferred to a memory module 66 in the system control 32. When a scan is completed, an array of raw k-space data has been acquired in the memory module 66. As will be described in more detail below, this raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in the disk memory 28. In response to commands received from the operator console 12, this image data may be archived on the tape drive 30, or it may be further processed by the image processor 22 and conveyed to the operator console 12 and presented on the display 16.

The present invention includes a method and system suitable for use with the above-referenced MR system, or any similar or equivalent system for obtaining MR images, that when used with a fast-imaging technique, such as fast spin echo (FSE) or echo planar imaging (EPI), minimizes ghosting effects caused by Maxwell terms and/or other OPF components.

In the presence of a spatially varying magnetic field along the phase encoding direction, the MR signal of the jth echo in a reference scan is given by:

$$S_j(k_x) = \int\int_{x,y} \rho(x,y) e^{-ik_x x} e^{-i\varphi_{0j}} e^{-i\varphi_{1j} x} e^{-\theta_j(y,t)} dx dy, \quad [1]$$

$$\theta_j(y,t) = 2\pi\gamma \int_0^{t_j} B(y,t') dt', \quad [1a]$$

$$k_x(t) = 2\pi\gamma \int_0^t G_x dt', \quad [1b]$$

where B(y,t) is the total OPF, j is the echo index in the reference scan echo train, $\rho(x,y)$ is the spin density function of the imaging object, $G_x$, is the readout gradient, $\gamma$ is the gyromagnetic ratio, x and y are the readout and phase-encoding spatial coordinates, respectively, $k_x$, is the Fourier conjugate of x, $\theta_j$ is the phase error associated with $B_j$, and $\phi_{0j}$ is the nominal constant phase error, $\phi_{1j}$ is the nominal linear phase error, which is typically caused by eddy currents produced by the readout gradient and acting upon the same readout axis. Although the phase errors produced by OPFs are generally time-dependent, this temporal dependence can be removed by using the value at the center of the echo j for each echo in the echo train, $\xi_j(y)$, to approximate $\theta_j(y,t)$ for simplicity of analysis. This assumption does not affect the generality of the proposed correction methods. Taking a one-dimensional inverse Fourier transform (iFT) on Eq. [1] and using the orthonormal property of the Fourier series, the projection along the readout direction from the jth echo is given by:

$$P_j(x) = e^{-i\varphi_{0j}} e^{-i\varphi_{1j} x} \int_y \rho(x,y) e^{-i\xi_j(y)} dy. \quad [2]$$

Since the phase term $\xi_j(y)$ caused by B(y,t) is inside the integral, both projection phase and amplitude are modulated. The phase and amplitude modulations can produce substantial errors in the calculation of the constant and linear phases, especially when the well-known Ahn-Cho algorithm is employed, as described in U.S. Pat. No. 5,151,656, assigned to the assignee of the present invention. With such errors in the k-space data, the performance of the phase correction can be compromised, leading to residual ghost artifacts.

Figure 2:
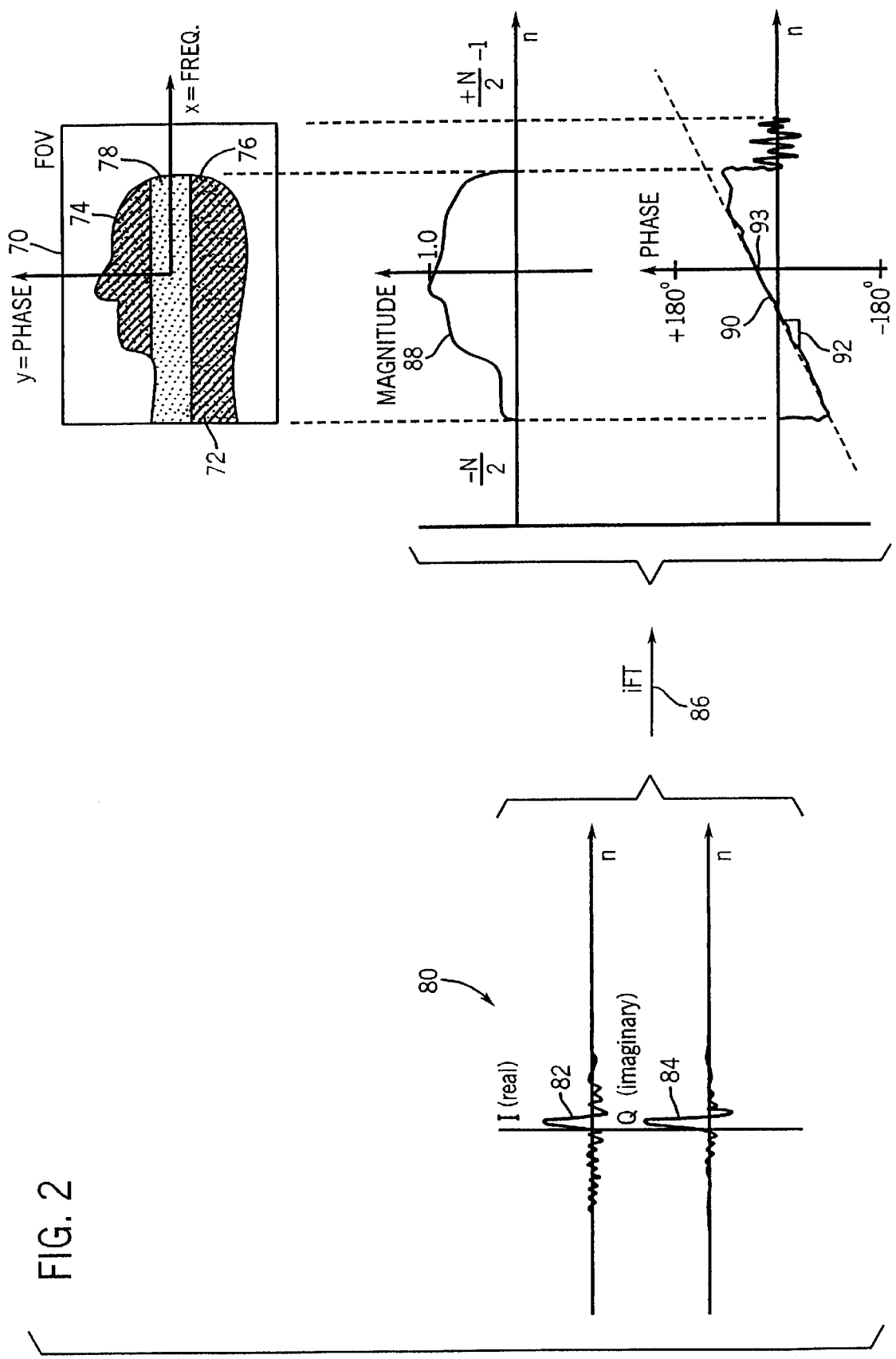
FIG. 2 is a graphical representation of an MR reference scan acquired according to the present invention and shows raw MR data in k-space and Fourier transformed MR image data in an image domain for use with a system as shown in FIG. 1.

The present invention minimizes the phase calculation errors due to $\mu_j(y)$. Referring to FIG. 2, a graphical representation of a system and method for use with the apparatus of FIG. 1 is shown. A reference scan is shown graphically in a field-of-view (FOV) 70 with the logical coordinates applied to the corresponding physical coordinates. That is, the phase encoding direction, or the logical y, corresponds to the physical y direction, and the frequency encoding direction, or logical x, lies in the physical z direction.

However, it is understood that the logical coordinates can be assigned to other physical coordinates, or a combination of physical coordinates, and although a sagittal image is depicted, the present invention is equally applicable to imaging in any plane in a subject 72.

The FOV 70 depicts a reference scan of the subject 72 in which the cross hatched areas 74, 76 are presaturated with one or more RF saturation pulses prior to the acquisition leaving a relatively narrow band 78 unsaturated. Saturation pulses are well-known in the art and are explained in U.S. Pat. No. 4,715,383, assigned to the assignee of the present invention. This relatively narrow band 78 is then used to acquire the MR reference scan. The technique therefore reduces the effective dimension of the object in the phase encoding (logical y) direction. That is, the effects of the eddy currents, Maxwell terms, or other OPFs, will be minimized if the object scanned is confined or limited in the phase encoding (logical y) direction. By restricting the acquisition in the phase encoding direction, the slope and intercept of the phase obtained from the reference scan projections will be less contaminated by the OPF phase $\mu_j(y)$, and thus will be more useful in accurately determining the phase errors that are used to correct the desired image.

FIG. 2 shows the complex MR echo signal 80 that results when the object is projected onto the readout gradient axis. The real component 82 and the imaginary component 84 of the complex signal 80 are the raw MR data in k-space that, when inversely Fourier transformed 86, create a magnitude component 88 and a phase component 90 in the image domain. The magnitude and phase components 88, 90 reflect the spatial projections of the imaging subject 72. In the example shown, the magnitude component 88 roughly conforms to the upper portion of the scanned subject 72 in the FOV 70. As shown, the magnitude component 88 has a positive value for each point the subject 72 is within the FOV 70. The phase component 90 is that portion of the image domain that is useful in determining phase errors to correct MR image data. That is, the intercept and slope of the phase component are used as the constant and linear phase errors, $\phi_0$ and $\phi_1$, respectively, as described in U.S. Pat. No. 5,151,656, assigned to the assignee of the present invention. Together, the intercept and/or slope data are herein referred to as phase characteristics, which can include one or the other, or both. It is preferred to use both in determining the phase errors, but it is recognized that one or the other may be employed to obtain better results than using neither.

Since the slope 92 and the intercept 93 of the phase data 90 are used to determine phase errors, the cleaner the data line 90, the more reliable and useful the phase errors will be. That is, the fewer perturbations to the phase data 90, the more reliable the information obtained from the slope and intercept. If the projection is corrupted and there are phase shifts in the vertical direction, the phase data 90 can excessively deviate and render the data useless in determining the time domain shift of the echo via the well-known Fourier shift theorem. By limiting the phase encoding dimension of the subject during acquisition of the reference scan, deviations in the phase data 90 are minimized, resulting in a more accurate determination of the phase slope 92 and the phase intercept 93 in order to find the time domain shift and the spatially constant phase errors, respectively.

Accordingly, the present invention includes a method of reducing perturbation field effects in MR images that includes the steps in acquiring raw MR data and transforming the raw MR data into MR image data, and acquiring an MR reference scan in the presence of perturbation fields. When acquiring the MR reference scan, the region of interest is limited to a relatively narrow band within the FOV. The method includes extracting phase correction values from at least one phase characteristic of a phase projection from the MR reference scan and then performing phase correction on the MR image data using the extracted phase correction values. The method includes reconstructing an MR image having reduced perturbation field effects using the corrected MR image data.

Preferably, the relatively narrow band is selected in a region OPF phase errors are minimal, and is parallel to a readout axis. In order to minimize the OPF phase error contributions, the region selected should be near the iso-center of the MRI magnet. More preferably, the narrow band is centered about the MR magnet's iso-center, meaning it is centered with respect to iso-center along the phase encoding direction, and not necessarily centered along the dimension of the frequency or slice encoding directions. Alternatively, the relatively narrow band can also be restricted along the phase encoding direction at a point where the OPF variations are minimal with respect to the phase encoding direction.

In one embodiment, as shown in FIG. 2, the method includes spatially saturating at least two regions 74, 76. The resulting relatively narrow band 78 located between the two saturated regions is then selected to perform the MR reference scan.

Figure 3:
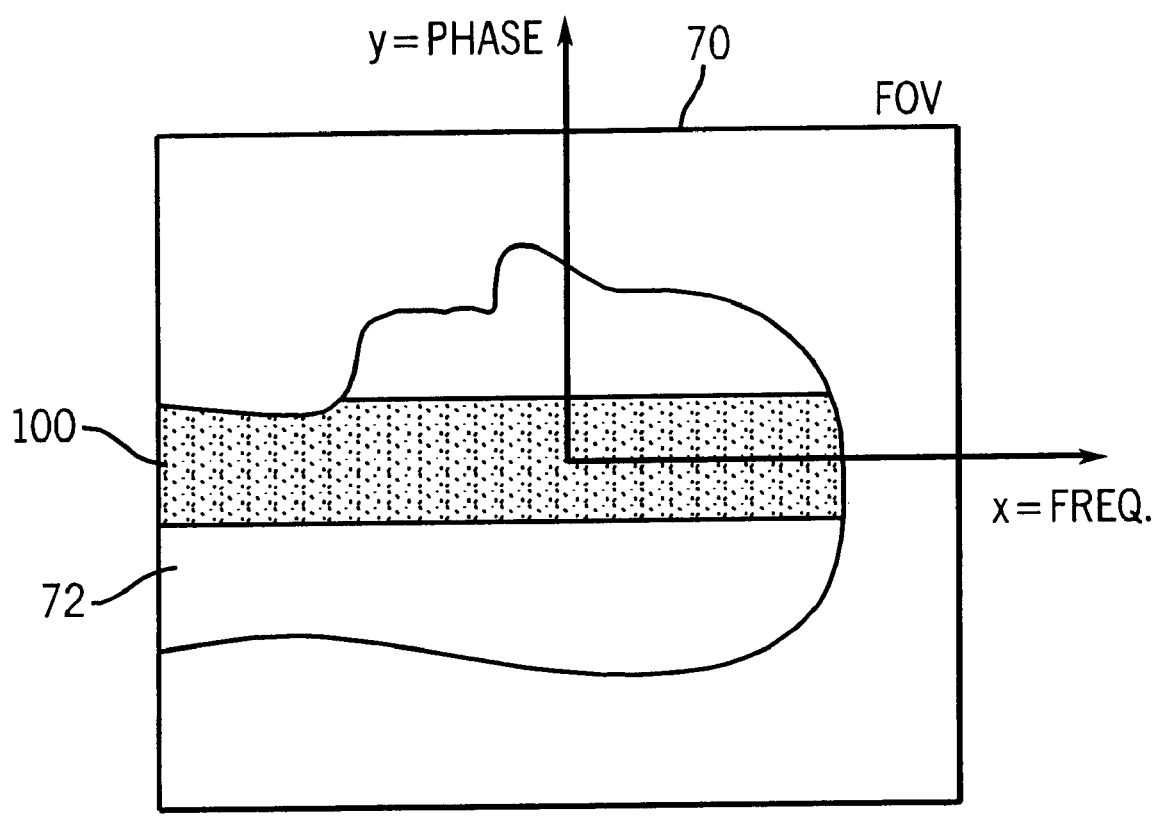
FIG. 3 shows an MR reference scan acquisition technique according to an alternate embodiment of the present invention.

Referring to FIG. 3, another embodiment of the present invention is disclosed in which the relatively narrow band 100 is selected parallel to a readout axis using a two-dimensional spatially selective RF pulse. Such a pulse is described by P. A. Bottomley and C. J. Hardy in an article published in *Journal of Applied Physics,* Vol.:62, pp. 4284–4290 (1987) entitled: Two-Dimensional Spatially Selective Spin Inversion and Spin-Echo Refocusing with a Single Nuclear Magnetic Resonance Pulse; and by T. J. Wieczorek and J. D. Pearlman, in an article in *J. Magnetic Resonance Imaging,* Vol.: 4(p), p. 62 (1994) entitled: Excitation of a 1 mm Diameter Beam with Response Modulated Excitation. Unlike the technique shown in FIG. 2, the technique employed in FIG. 3 does not involve presaturation, but employs a volumetric selective pulse to acquire the relatively narrow band 100 parallel to the readout axis. Additionally, when using a pulse sequence that is susceptible to chemical shift affects, such as an EPI pulse sequence, the two dimensional spatially selective RF pulse would preferably include spectral selectivity to eliminate off resonance signals associated with fat. The present invention is also applicable to other pulse sequences, including non-EPI techniques employing echo trains, such as FSE; gradient and spin echo (GRASE), described by Oshio, K. and Feinberg, D. A. in an article published in *Magnetic Resonance in Medicine,* Vol.: 20, pp 344–349 (1991) entitled: GRASE (Gradient and Spin-echo) Imaging: A Novel Fast MRI Technique; and BURST imaging, described by Hennig, J. and Mueri, M., in an article published in the Abstracts of the Society of Magnetic Resonance in Medicine, pp 238 (1988) entitled: Fast Imaging Using Burst Excitation Pulses.

Using either approach, the centralized band 78, 100 must be selected large enough to acquire data with sufficient signal-to-noise ratio, yet narrow enough to minimize OPFs.

Accordingly, the present invention also includes a method of reducing ghost artifacts and minimizing phase errors in MR image acquisition that includes acquiring MR data and acquiring an MR reference scan in the presence of OPFs in a limited region of interest parallel to a readout axis. The method includes determining phase characteristics from the MR reference scan to obtain phase correction values only within the limited region parallel to the readout axis and then performing phase correction on the acquired MR data using the phase correction values.

The aforementioned method is incorporated into an MRI apparatus to create MR images using a fast imaging technique and having reduced ghost artifacts. The MRI apparatus includes an MRI system, such as that disclosed with reference to FIG. 1. A computer is programmed to acquire raw MR data and transform the raw MR data to MR image data and acquire a separate MR reference scan in the presence of OPFs from a limited region of interest within a FOV. The limited region of interest is selected as a relatively narrow band where OPF phase errors are minimal, or constant, and where the relatively narrow band is parallel to a readout axis. The computer is programmed to either spatially saturate a pair of regions surrounding the desired relatively narrow band, or select the relatively narrow band using a volumetric spatially selective RF pulse. The computer is programmed to then extract phase correction values from phase characteristics of a phase projection of the MR reference scan, and then perform phase correction on the MR image data using the phase correction values to reconstruct an MR image having reduced OPF effects, thereby reducing ghost artifacts in the final MR image.

Accordingly, the invention also includes a computer readable storage medium having stored thereon a computer program for use with an MRI apparatus comprising instructions which, when executed by a computer, causes the computer to acquire MR data of a region of interest, reduce the region of interest in at least one dimension, and acquire an MR reference scan of the reduced region of interest in the presence of a frequency encoding gradient. The reduction in the region of interest provides a phase perturbation error reduction in the MR reference scan in the at least one dimension. The computer program is also designed to obtain phase correction values from a slope and intercept of a phase representation of the MR reference scan and reconstruct an MR image using the phase correction values and the MR data.

In one embodiment, the computer program causes the computer and MRI system to apply a spatial saturation pulse to saturate selected areas thereby reducing the region of interest in at least one dimension. The spatial saturation pulse is designed to saturate at least one region to define a relatively narrow band where data is then acquired for the reference scan. In another embodiment, the computer is programmed to apply a volumetric, spatially selective RF pulse to reduce the region of interest, preferably, parallel to a readout axis for selecting the reference scan data.

The present invention has been described in terms of the preferred embodiment, and it is recognized that equivalents, alternatives, and modifications, aside from those expressly stated, are possible and within the scope of the appending claims.

What is claimed is:

1. A method of reducing perturbation field effects in MR images comprising the steps of:
   acquiring raw MR data and transforming the raw MR data to MR image data;
   acquiring an MR reference scan in the presence of perturbation fields having a region of interest limited to a relatively narrow band within a field-of-view;
   extracting phase correction values from at least one phase characteristic from the MR reference scan;
   performing phase correction on the MR image data using the extracted phase correction values; and
   reconstructing an MR image using the corrected MR image data, the reconstructed MR image having reduced perturbation field effects.

2. The method of claim 1 wherein the relatively narrow band is selected in a region where orthogonal perturbation field phase errors are minimal and is parallel to a readout axis.

3. The method of claim 2 wherein the region selected is near an iso-center of an MRI apparatus magnet or along a phase encoding direction at a point where OPF variations are minimal with respect to the phase encoding direction.

4. The method of claim 1 further comprising the step of spatially saturating at least one region to define the relatively narrow band.

5. The method of claim 1 wherein the relatively narrow band is parallel to a readout axis and the region of interest is selected using a 2-D spatially selective RF pulse to create the relatively narrow band parallel to a readout axis.

6. The method of claim 5 wherein the raw MR data and the MR reference scan are acquired using EPI and the 2-D spatially selective RF pulse includes spectral selectivity to eliminate off-resonance signals associated with fat.

7. The method of claim 1 wherein a width of the relatively narrow band is selected to minimize orthogonal perturbation fields, yet large enough to acquire data having a sufficient signal-to-noise ratio.

8. The method of claim 1 wherein the relatively narrow band is selected in a region where orthogonal perturbation field phase errors are approximately constant.

9. A method of reducing ghost artifacts and minimizing phase errors in MR image acquisition comprising the steps of:
   acquiring MR data;
   acquiring MR reference scan data in the presence of perturbation fields in a region of interest limited to a region parallel to a readout axis;
   determining at least one phase characteristic from a phase of the MR reference scan data to determine phase correction values only within the limited region parallel to the readout axis in the region of interest; and
   performing phase correction on the acquired MR data using the phase correction values.

10. The method of claim 9 wherein the region of interest is selected using a 2-D spatially selective RF pulse to create a relatively narrow band parallel to the readout axis.

11. The method of claim 10 wherein the MR data and the MR reference scan data are acquired using a pulse sequence that is susceptible to chemical shift affects and the 2-D spatially selective RF pulse includes spectral selectivity to eliminate off-resonance signals for fat, and the method further comprises the step of reconstructing an MR image using the corrected MR data, the reconstructed MR image having reduced orthogonal perturbation field effects.

12. The method of claim 9 further comprising the step of spatially saturating at least two regions, the at least two regions being separated by the region parallel to the readout axis.

13. The method of claim 9 wherein a width of the region parallel to the readout axis in the region of interest is selected to minimize orthogonal perturbation fields, yet large enough to acquire data having a sufficient signal-to-noise ratio.

14. An MRI apparatus to create MR images acquired using a fast imaging technique and having reduced ghost artifacts comprising:
   a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and a computer programmed to:
acquire raw MR data and transform the raw MR data to MR image data;
acquire an MR reference scan in the presence of perturbation fields having a limited region of interest within a field-of-view;
extract phase correction values from phase characteristics of a phase projection of the MR reference scan;
perform phase correction on the MR image data using the extracted phase correction values; and
reconstruct an MR image using the corrected MR image data, the reconstructed MR image having reduced orthogonal perturbation field effects.

15. The MRI apparatus of claim 14 wherein the computer is further programmed to select a relatively narrow band where orthogonal perturbation field phase errors are minimal and is parallel to a readout axis as the limited region of interest.

16. The MRI apparatus of claim 14 wherein the computer is further programmed to spatially saturate at least two regions, the at least two regions separated by a relatively narrow band thereby forming the limited region of interest.

17. The MRI apparatus of claim 14 wherein the computer is further programmed to select a relatively narrow band parallel to a readout axis using a volumetric spatially selective RF pulse.

18. The MRI apparatus of claim 14 wherein the computer is further programmed to select a relatively narrow band where orthogonal perturbation field phase errors are approximately constant and is parallel to a readout axis as the limited region of interest.

19. A computer readable storage medium having stored thereon a computer program for use with an MRI apparatus comprising instructions which, when executed by a computer, cause the computer to:
acquire MR data of a region of interest;
reduce the region of interest in at least one dimension;
acquire an MR reference scan of the reduced region of interest in the presence of a frequency encoding gradient, the reduced region of interest providing a phase perturbation error reduction in the MR reference scan in the at least one dimension; and
obtain phase correction values $\phi_0$ and $\phi_1$ from phase characteristics of the MR reference scan.

20. The computer readable storage medium of claim 19 wherein the computer program further causes the computer to reconstruct an MR image using the phase correction values $\phi_0$ and $\phi_1$, and the MR data, the reconstructed MR image having reduced magnetic field perturbation effects and reduced ghost artifacts.

21. The computer readable storage medium of claim 19 wherein the computer program further causes the computer to apply at least one spatial saturation pulse to saturate at least one selected region to reduce the region of interest in the at least one dimension which defines a relatively narrow band wherein a width of the relatively narrow band is selected to minimize orthogonal perturbation fields, yet large enough to acquire data having a sufficient signal-to-noise ratio.

22. The computer readable storage medium of claim 19 wherein the at least one direction is a phase encoding direction.

23. The computer readable storage medium of claim 19 wherein the computer program further causes the computer to apply a volumetric spatially selective RF pulse to reduce the region of interest that is a relatively narrow band parallel to a readout axis.

* * * * *